(12) United States Patent
Ueda

(10) Patent No.: US 7,529,147 B2
(45) Date of Patent: May 5, 2009

(54) SEMICONDUCTOR DEVICE AND METHOD OF FABRICATING THE SAME

(75) Inventor: Takehiro Ueda, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 27 days.

(21) Appl. No.: 11/591,573

(22) Filed: Nov. 2, 2006

(65) Prior Publication Data

US 2007/0108550 A1  May 17, 2007

(30) Foreign Application Priority Data

Nov. 11, 2005  (JP)  ............................. 2005-327248

(51) Int. Cl.
  *G11C 17/18* (2006.01)
  *G11C 5/06* (2006.01)

(52) U.S. Cl. .................. 365/225.7; 365/63; 257/209; 257/529; 257/E21.592; 257/E23.149

(58) Field of Classification Search ............. 365/225.7; 257/529, E21.529, E23.149
See application file for complete search history.

(56) References Cited

U.S. PATENT DOCUMENTS

| | | | | |
|---|---|---|---|---|
| 4,769,791 A | * | 9/1988 | Liou et al. .................. 365/203 |
| 5,394,368 A | * | 2/1995 | Miyamoto .................. 365/200 |
| 5,412,593 A | * | 5/1995 | Magel et al. ................. 365/96 |
| 6,014,052 A | * | 1/2000 | Coupe, II .................... 327/525 |
| 6,021,078 A | * | 2/2000 | Le et al. .................. 365/225.7 |
| 6,227,637 B1 | * | 5/2001 | Phan ........................... 327/525 |
| 6,356,496 B1 | * | 3/2002 | Carroll et al. ............ 365/225.7 |
| 7,057,441 B2 | * | 6/2006 | Yoon .......................... 327/526 |
| 7,119,414 B2 | * | 10/2006 | Hisaka ........................ 257/529 |
| 2004/0224444 A1 | | 11/2004 | Hisaka | |
| 2005/0258504 A1 | * | 11/2005 | Cheng et al. ................. 257/528 |

FOREIGN PATENT DOCUMENTS

| | | |
|---|---|---|
| JP | 11-297837 | 10/1999 |
| JP | 2005-039220 | 2/2005 |
| JP | 2005-057186 | 3/2005 |

OTHER PUBLICATIONS

Chinese Office Action dated Jul. 4, 2008 with English Translation.

* cited by examiner

*Primary Examiner*—Ly D Pham
(74) *Attorney, Agent, or Firm*—McGinn IP Law Group, PLLC

(57) ABSTRACT

The semiconductor device has a semiconductor substrate; an electric fuse provided on the semiconductor substrate, and having a first fuse link and a second fuse link connected in series; and a terminal provided between the first fuse link and the second fuse link, wherein the first fuse link and the second fuse link are configured as being different from each other in current value necessary for blowing.

12 Claims, 7 Drawing Sheets

ND METHOD# SEMICONDUCTOR DEVICE AND METHOD OF FABRICATING THE SAME

This application is based on Japanese patent application No. 2005-327248 the content of which is incorporated hereinto by reference.

BACKGROUND

1. Technical Field

The present invention relates to a semiconductor device and a method of fabricating the same, and in particular to a semiconductor device containing an electric fuse and a method of fabricating the same.

2. Related Art

There has been known a technique of mounting a fuse on a semiconductor device, and blowing the fuse so as to adjust values of a resistor used for the semiconductor device, or to disconnect a nonconforming element for replacement with a normal element.

Laser irradiation to a position of blowing of the fuse is one of known methods of blowing the fuse. Japanese Laid-Open Patent Publication No. H11-297837 discloses a technique of solving the problems below anticipated about the fuse blown by laser. That is, as the design rule of semiconductor devices shrinks, interconnections to be disconnected also shrink, so that there is a growing demand on a higher level of positioning accuracy in the laser irradiation, for a laser repair apparatus used for blowing the fuse interconnection. However, use of a new apparatus for every product of a new generation results in endless increase in the production cost. Aiming at providing a technique of exactly blowing the fuse using a former-generation laser repair apparatus having only a limited level of positioning accuracy, Japanese Laid-Open Patent Publication No. H11-297837 proposes a circuit configuration having a plurality of interconnections to be disconnected for switching a single internal circuit, allowing switching of the circuit only if either one of the plurality of interconnections is disconnected. It was reportedly made possible to reduce any opportunities of switching failure of the circuits, due to misalignment of a laser beam onto the interconnection to be disconnected.

On the other hand, unlike the blowing of fuse based on the laser irradiation, there is known another method of blowing the fuse by current supply (Japanese Laid-Open Patent Publication Nos. 2005-39220 and 2005-57186). Japanese Laid-Open Patent Publication No. 2005-39220 discloses a fuse which can be blown by a smaller energy of current. According to the Publication No. 2005-39220, a conductor composing the fuse is formed as being folded a plurality of times.

Japanese Laid-Open Patent Publication No. 2005-57186 discloses a configuration in which a fuse is surrounded, specifically in the portion to be blown, by a plate so as to confine heat generated in the portion to be blown within an area at around that portion, when current is supplied to the fuse.

The current-disconnection-type fuse (E fuse, referred to as electric fuse, hereinafter), blowing the fuse by supplying thereto a predetermined energy of current, is intrinsically free from a problem in positioning accuracy which is anticipated in the system blowing the fuse by laser irradiation.

The electric fuse, however, is in need of further improvement in the yield ratio of disconnection. It was also found that the electric fuse has arisen some new problems.

The electric fuse may be re-connected in the portion once it was blown, if blowing of the electric fuse is followed by annealing. In particular for the case where the electric fuse is composed of a material causative of electro-migration, it is anticipated that the portion once blown may be re-connected as being affected by electro-migration of the material, when the blowing of electric fuse is followed by annealing. Once such re-connection should occur, detection of whether the electric fuse has been blown or not cannot give a correct result, even if the electric fuse to be blown is once disconnected.

Although incidence of the re-connection or re-disconnection described in the above may actually be not so large, so that use of the electric fuse may be supposed as being of no problem so far as the fuse is adopted to normal operations, it is still necessary to further improve the hold characteristic, a capability of the electric fuse holding the blown state, for the case where an extremely advanced level of reliability is demanded for the semiconductor device, or for the case where the semiconductor device is used under severe conditions.

SUMMARY OF THE INVENTION

According to the present invention, there is provided a semiconductor device which includes:

a semiconductor substrate;

an electric fuse provided on the semiconductor substrate, and having a first fuse link and a second fuse link connected in series; and a terminal provided between the first fuse link and the second fuse link, thereby allowing current to flow selectively to the first fuse link, wherein the first fuse link and the second fuse link are configured as being different from each other in current value necessary for blowing.

The electric fuse referred to as herein means a fuse which can be blown by current or voltage application. The fuse link referred to as herein means a portion-to-be-blown of the electric fuse. Whether the electric fuse has been blown or not is judged based on whether at least one of the fuse link among the two fuse links connected in series has been blown or not.

Two fuse links contained in the electric fuse are connected in series in the semiconductor device of the present invention, so that the configuration allows detection of current after passing through two these fuse links. As a consequence, even if either one of two fuse links is accidentally re-connected, the electric fuse can be judged as being blown, if the other one remains disconnected. By virtue of this configuration, the electric fuse can considerably reduce the ratio of re-connection on the squared basis as compared with that of an electric fuse having only one fuse link. The ratio of re-connection referred to herein means a possibility of that an electric fuse once blown is undesirably detected as being connected, due to re-connection thereof. The semiconductor device of the invention can enhance the hold characteristic of the electric fuse therein.

Unlike the technology described in Japanese Laid-Open Patent Publication No. H11-297837, the present invention aims at reducing the ratio of re-connection of the electric fuse to a large degree, and to improve the hold characteristic. The ratio of re-connection is, however cannot be reduced, if only one of two fuse links is blown in the process of blowing the electric fuse. In order to reduce the ratio of re-connection, it is therefore necessary to respectively blow both of two fuse links. For the case where the fuse links are blown by supplying current to the electric fuse configured as having two fuse links connected in series, the current can no more flow through the electric fuse if either one of fuse links is blown. It is therefore necessary to configure the electric fuse so that, even after either one of the fuse links is blown, the current can flow through the other fuse link.

In the present invention, two fuse links are made different in readiness of blowing. As a consequence, the more-blowable fuse link can be blown by using the less-blowable fuse link as an interconnection, and by supplying current from the source line through the less-blowable fuse to the more-blowable fuse link. By virtue of provision of the terminal between the first fuse link and the second fuse link, the less-blowable fuse link can be blown by applying, using the terminal, voltage only to the less-blowable fuse link. In this way, two fuse links can independently be blown. Yield of disconnection can also be improved.

According to the present invention, there is also provided a method of fabricating a semiconductor device having an electric fuse provided on a semiconductor substrate, and containing a first fuse link and a second fuse link connected in series, the method includes:

blowing the second fuse link by supplying a first current through the first fuse link to the second fuse link; and blowing the first fuse link by supplying a second current having a larger current value than that of the first current to the first fuse link.

The process step of blowing the first fuse link herein is placed after the process step of blowing the second fuse link. The step-wise blowing of the fuse links allows a single power supply source to independently blow two fuse links.

The present invention can therefore improve the hold characteristic of the electric fuse.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to an illustrative embodiment. Those skilled in the art will recognize that many alternative embodiments can be accomplished using the teachings of the present invention and that the invention is not limited to the embodiment illustrated for explanatory purposes.

Figure 1:
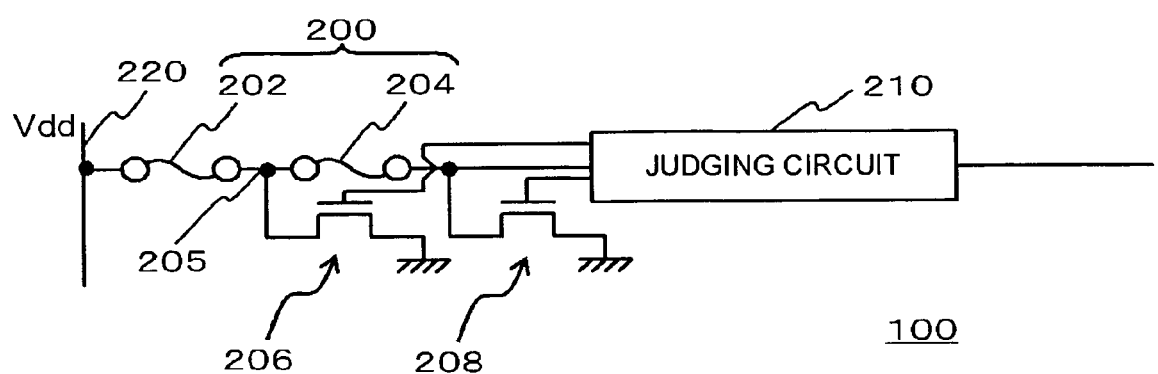
FIG. 1 is a circuit diagram showing a configuration of a semiconductor device containing an electric fuse in one embodiment of the present invention.

FIG. 1 is a circuit diagram showing a configuration of a semiconductor device containing an electric fuse in one embodiment of the present invention.

In this embodiment, a semiconductor device 100 contains a semiconductor substrate (not shown), an insulating film (not shown) formed on the semiconductor substrate, an electric fuse 200 formed thereon, a source line 220 connected to one end of the electric fuse 200, and a judging circuit 210 connected to the other end of the electric fuse 200. In this embodiment, the judging circuit 210 also has a function of a control circuit for transistors to be disconnected.

The electric fuse 200 contains a first fuse link 202 and a second fuse link 204 connected in series with each other. Both of the first fuse link 202 and the second fuse link 204 are composed of electro-conductive materials, and configured as being blown when supplied with current exceeding the respectively-predetermined current values.

Between the first fuse link 202 and the second fuse link 204, there is provided a terminal 205. The semiconductor device 100 further contains a first transistor 206 and a second transistor 208. The first transistor 206 has a gate electrode connected to the judging circuit 210, and has source/drain electrodes wherein one of which connected to the terminal 205, and the other to the ground. The second transistor 208 has a gate electrode connected to the judging circuit 210, and has source/drain electrodes wherein one of which connected to one end of the second fuse link 204 opposite to the terminal 205, and the other to the ground.

The first fuse link 202 and the second fuse link 204 are configured as being different from each other in current value necessary for blowing. In this embodiment, the first fuse link 202 can be configured as being less blowable than the second fuse link 204. In other words, the first fuse link 202 can be configured as needing a larger current value for blowing than that of the second fuse link 204. By virtue of this configuration, the first fuse link 202 is allowed to function as an interconnect for supplying current to the second fuse link 204, in the process of blowing the second fuse link 204. The succeeding blowing of the first fuse 202 is accomplished by independently applying voltage to the first fuse link 202 so as to allow current to flow therethrough. In this way, first fuse link 202 and the second fuse link 204 can independently, and exactly be blown by the current supplied from the source line 220.

The first fuse link 202 and the second fuse link 204 can typically be composed of different materials. In this case, the first fuse link 202 and the second fuse link 204 may have the same geometry, or may have different geometries.

For example, the first fuse link 202 may be configured using a copper-containing metal film having copper as a major component, and the second fuse link 204 may be configured using a polysilicon film. By this configuration, the first fuse link 202 is made less-blowable than the second fuse link 204. The copper-containing metal film herein may contain silver. The copper-containing metal film may also contain any one of, or two or more of different elements selected from the group consisting of Au, Pt, Cr, Mo, W, Mg, Be, Zn, Pd, Cd, Hg, Si, Zr, Ti and Sn. The second fuse link 204 may be configured as having a refractory metal film or a silicide film formed on the surface of the polysilicon film. For example, the second fuse link 204 may be configured as having a cobalt silicide film formed on the surface of the polysilicon film.

The first fuse link 202 and the second fuse link 204 may also be configured as having different geometries. For example, the first fuse link 202 may be wider in width and shorter in length than the second fuse link 204. In this way, the first fuse link 202 can be configured as being less blowable than the second fuse link 204. In this case, the first fuse link 202 and the second fuse link 204 may be composed of the same material, or may be composed of different materials.

Paragraphs below will explain procedures of blowing of thus-configured electric fuse based on current supply, referring to FIGS. 2A to 2D. The electric fuse 200 is blown by a step of blowing the second fuse link 204 by supplying a first current through the first fuse link 202 to the second fuse link 204; and a step of blowing the first fuse link 202 by supplying a second current having a larger current value than that of the first current to the first fuse link 202.

As described later, the semiconductor device 100 may contain a plurality of electric fuses 200. Which electric fuse 200 is to be blown is appropriately selected under control by the judging circuit 210. In this embodiment, the first fuse link 202 and the second fuse link 204 are respectively blown in the electric fuse 200 selected as a target for blowing.

Figure 2A:
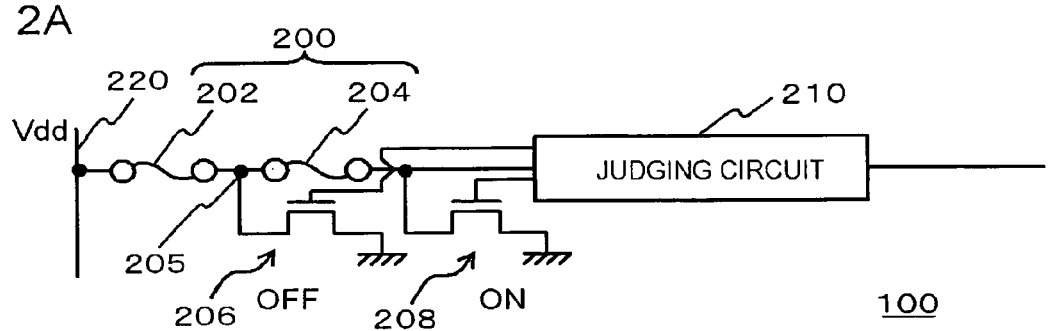
FIGS. 2A to 2D are drawings explaining procedures of blowing the electric fuse in the embodiment of the present invention.
Figure 2B:
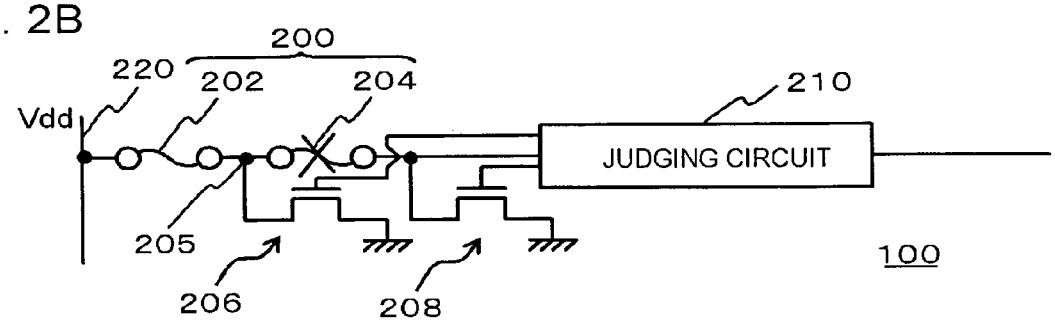
Figure 2C:
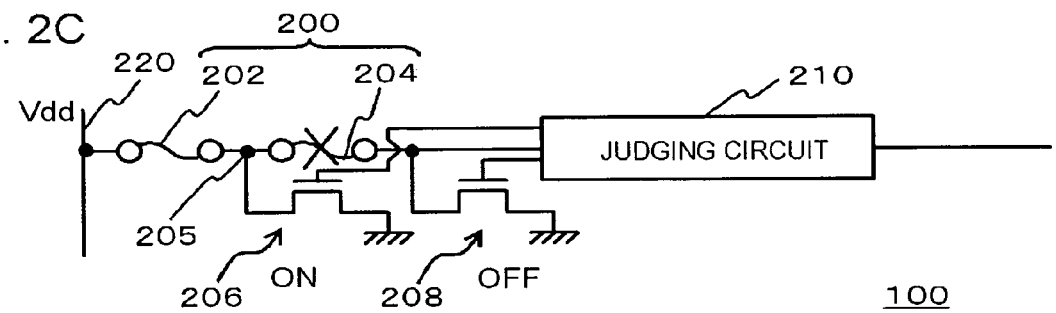

The source line 220 herein is connected to a power source, and applied with a source voltage Vdd. First, the second transistor 208 is turned on, and the first transistor 206 is turned off. This setting allows current from the source line 220 to flow through the first fuse link 202 and the second fuse link 204 (FIG. 2A). The more-blowable second fuse link 204 is then blown (FIG. 2B). The first fuse link 202 herein less blowable than the second fuse link 204 can function as an interconnect until the second fuse link 204 is blown. Once the second fuse link 204 is blown, the current no more flows through the electric fuse 200.

Figure 2D:
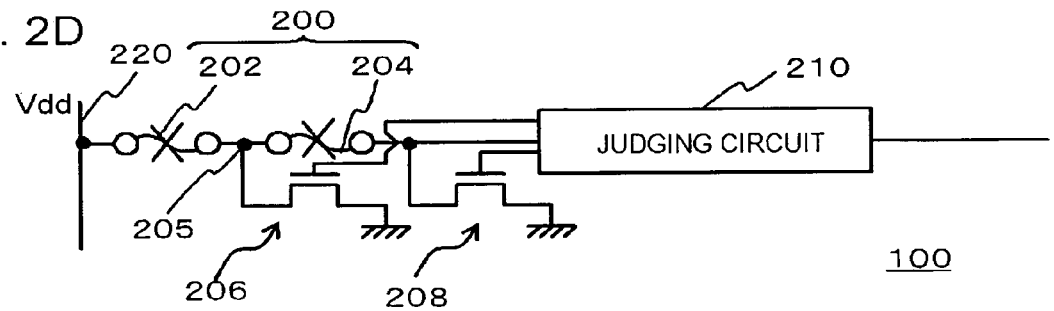

Next, the first transistor 206 is turned on, and the second transistor 208 is turned off. This setting allows the current from the source line 220 to flow through the first fuse link 202 (FIG. 2C), and the first fuse link 202 is blown (FIG. 2D). The first fuse link 202 herein can be blown by supplying thereto a current having a larger current value than that used for blowing the second fuse link 204.

By the steps described in the above, two fuse links in the electric fuse 200 can respectively be blown in an exact manner. In this embodiment, two fuse links differ in readiness of blowing. As a consequence, the more-blowable fuse link can be blown by allowing the current from a single source line to flow therethrough using the less-blowable fuse link as an interconnect. Next, the less-blowable fuse link can be blown by independently allowing the current to flow therethrough. In this way, two fuse links can be blown without increasing the number of current sources, so that only a simple configuration can independently blow two fuse links.

Figure 3:
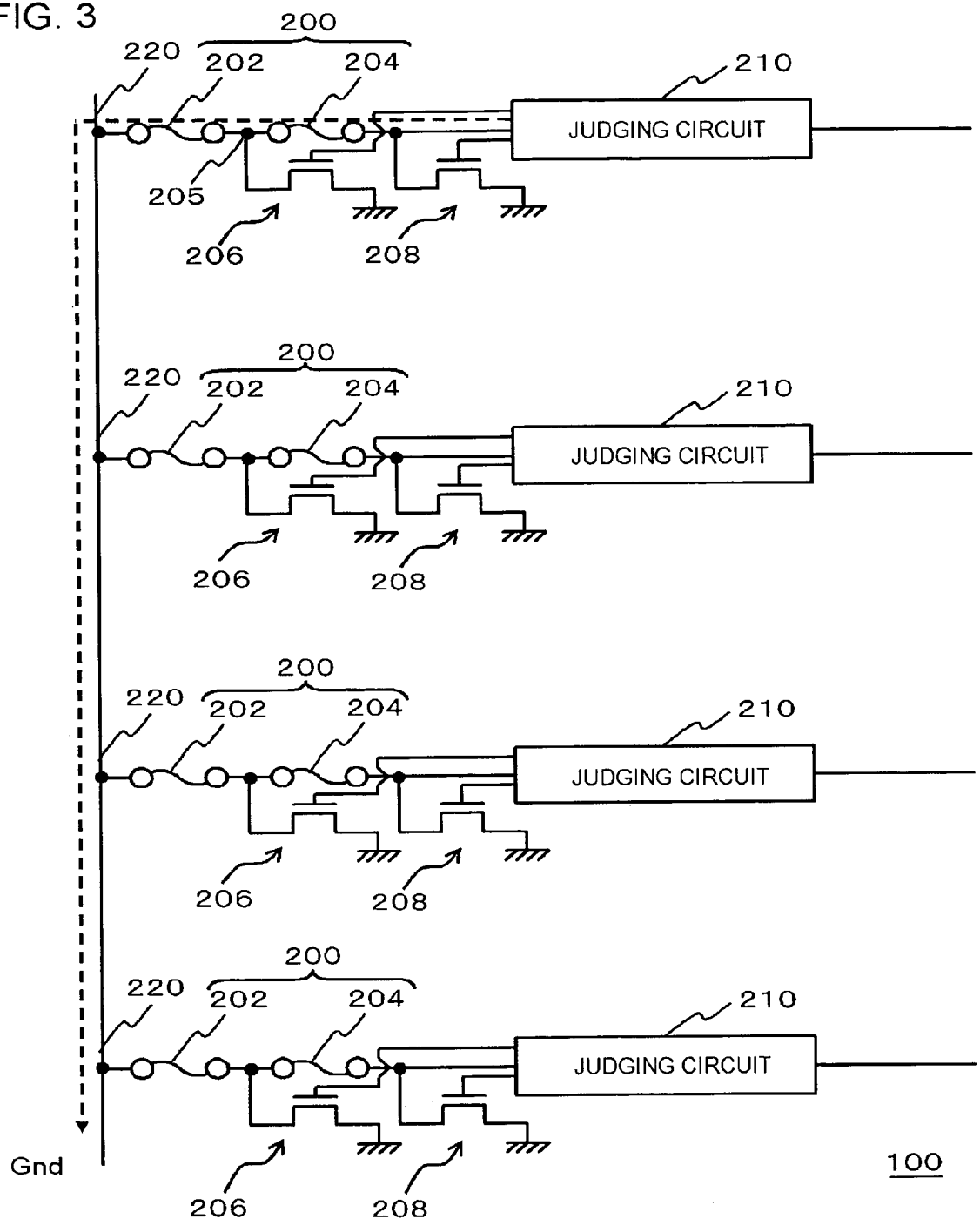
FIG. 3 is a drawing explaining procedures of judging a blown state of the electric fuse in the embodiment of the present invention.

Paragraphs below will explain procedures of judging a blown state of the electric fuse 200 in the embodiment of the present invention, referring to FIG. 3.

A predetermined signal is now output from the judging circuit 210 connected to the electric fuse 200 to be judged, and the source line 220 is grounded. While keeping this state, whether the electric fuse 200 to be judged is blown or not can be judged by detecting electric conduction with the source line 220.

By virtue of the configuration of the electric fuse 200 of this embodiment having the first fuse link 202 and the second fuse link 204 are connected in series, the electric fuse 200 can be judged as being blown if at least one of the first fuse link 202 and the second fuse link 204 is blown. As a consequence, even for the case where the re-connection of the first fuse link 202 and the second fuse link 204 is anticipated during annealing and the like after blowing of the electric fuse 200, the ratio of re-connection can be reduced on the squared basis. In this embodiment, even for the case where a plurality of electric fuses 200 are connected to the source line 220, the blown state of the individual electric fuses 200 can independently be judged.

Figure 6:
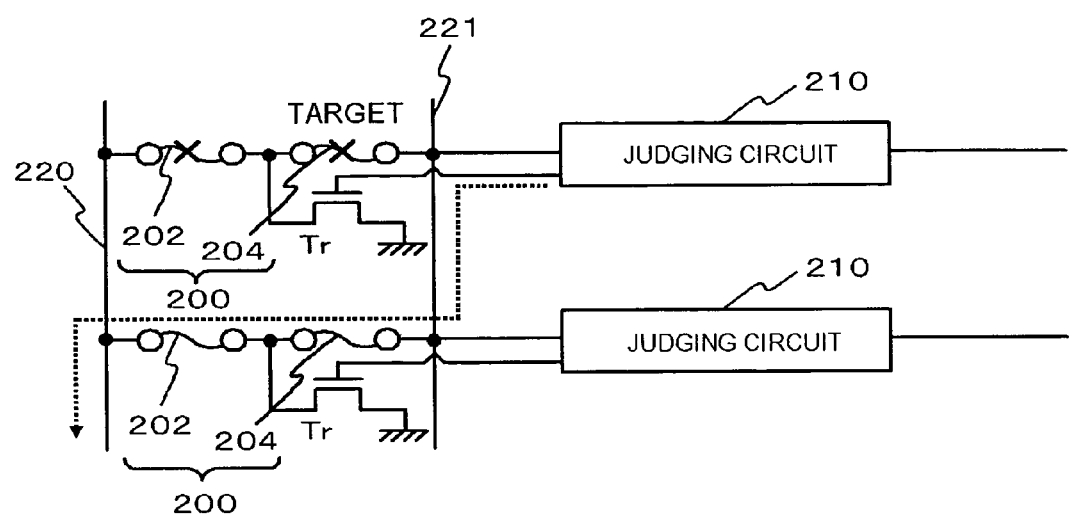
FIG. 6 is a drawing showing configuration using two source lines for blowing the electric fuse.

In order to independently blow the first fuse link 202 and the second fuse link 204 connected in series in the electric fuse 200 without using the first fuse link 202 as an interconnect when blowing the second fuse link 204, one possible configuration is typically such as shown in FIG. 6, additionally having a source line 221 on the second fuse link 204 side, besides the source line 220 applying the source voltage to the first fuse link 202. This configuration, however, raises a problem in that, even when it is desired to judge the blown state of a certain blown electric fuse 200 as a target for judgment by the judging circuit 210, current undesirably flows through the source line 221 and through the other unblown electric fuse 200 other than the target for judgment, as indicated by the dashed line in the drawing, so that correct judgment is inhibited.

On the other hand, this embodiment adopts a method of blowing the second fuse link 204 making the first fuse link 202 function as an interconnect as described in the above, so that only a single power supply source can independently blow two fuse links. As a consequence, the judging circuit 210 can make an exact judgment.

Figure 4A:
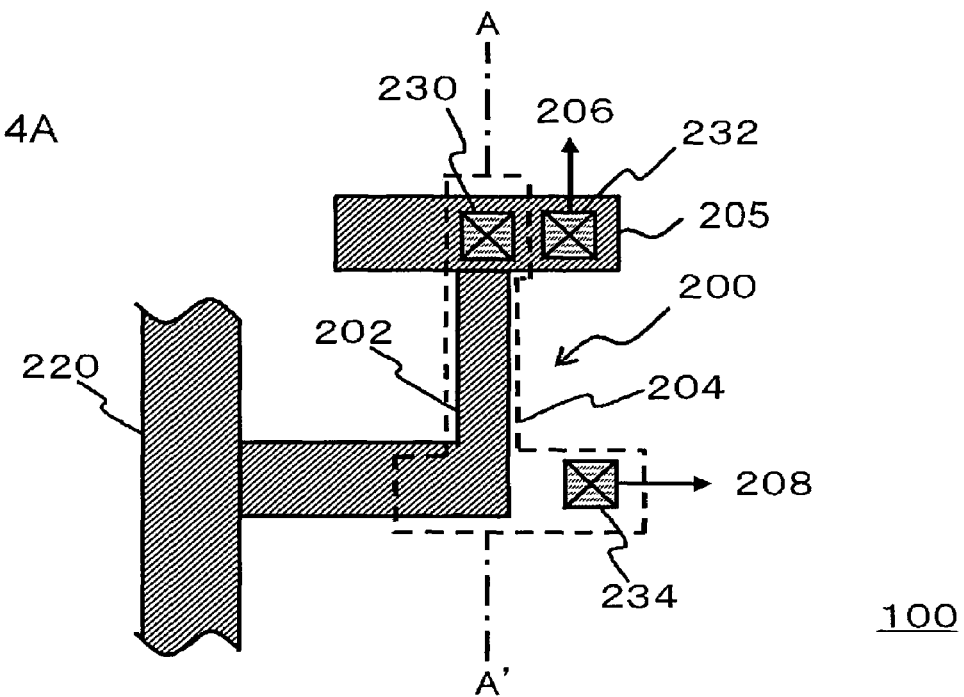
FIGS. 4A and 4B are drawings schematically showing a configuration of the semiconductor device in the embodiment of the present invention.
Figure 4B:
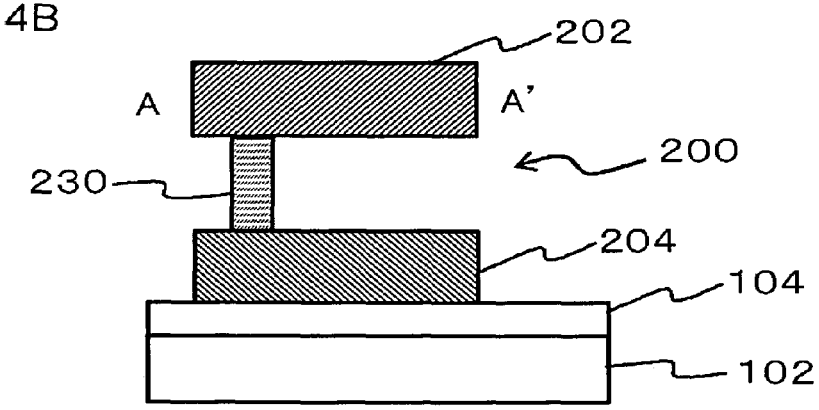

FIGS. 4A and 4B are drawings schematically showing a configuration of the semiconductor device 100 of this embodiment.

FIG. 4A is a top view showing a part of the semiconductor device 100. The exemplary case shown herein is such that the first fuse link 202 is composed of a copper-containing metal film, and the second fuse link 204 is composed of a polysilicon film. FIG. 4B is a sectional view taken along line A-A' in FIG. 4A. The semiconductor device 100 contains a semiconductor substrate 102, a field insulating film 104 formed thereon, the second fuse link 204 formed thereon, an interlayer insulating film (not shown) formed thereon, and the first fuse link 202 formed thereon. The second fuse link 204 can be formed in the same layer with the gate electrodes of the MOS transistors, and in the same process of forming the gate electrodes. The second fuse link 204 and the first fuse link 202 can electrically be connected with each other via a first plug 230 formed in the interlayer insulating film under the terminal 205.

As shown in FIG. 4A, the source line 220 can be configured using a copper-containing metal film, and can be formed in the same layer with the first fuse link 202. The first fuse link 202 is connected via a second plug 232 formed under the terminal 205 to either one of the source/drain electrodes of the first transistor 206. On the other hand, the second fuse link 204 is connected via a third plug 234 to either one of the source/drain electrodes of the second transistor 208.

By this configuration, the first fuse link 202 and the second fuse link 204 can be formed at the same time with the MOS transistors, the source line 220 and other elements, allowing fabrication of the electric fuse 200 only by a simple process.

As another example, the electric fuse 200 may be formed in any level, so far as it is provided over the semiconductor substrate.

Paragraphs in the above have described embodiments of the present invention referring to the attached drawings only as mere examples of the present invention, while allowing adoption of various configuration other than those described in the above.

The electric fuse 200 described in the above embodiments was configured as having two fuse links, whereas the electric fuse 200 may contain three or more fuse links. Also in this case, the individual fuse links can be connected in series typically in the order of difficulty in blowing from the proximal to the distal of the source line, and as being independently applied with voltage making use of transistors or other switch elements. This configuration allows exact blowing of the individual fuse links in the electric fuse containing a plurality of fuse links. The ratio of re-connection can be reduced to a large degree, by increasing the number of fuse links contained in the electric fuse 200 based on this configuration.

The first fuse link 202 and the second fuse link 204 of the electric fuse 200 can be formed into various geometries. For example, the first fuse link 202 and the second fuse link 204 may have folded portions as described in Japanese Laid-Open Patent Publication Nos. 2005-39220 and 2005-57186.

The materials composing the fuse links of the electric fuse 200 in the above-described embodiments were exemplified by the copper-containing metal film and the polysilicon film, whereas other material can appropriately be used. The present invention is effective in particular for the case where the fuse links are formed using a material causative of re-connection due to electro-migration or the like.

Figure 7:
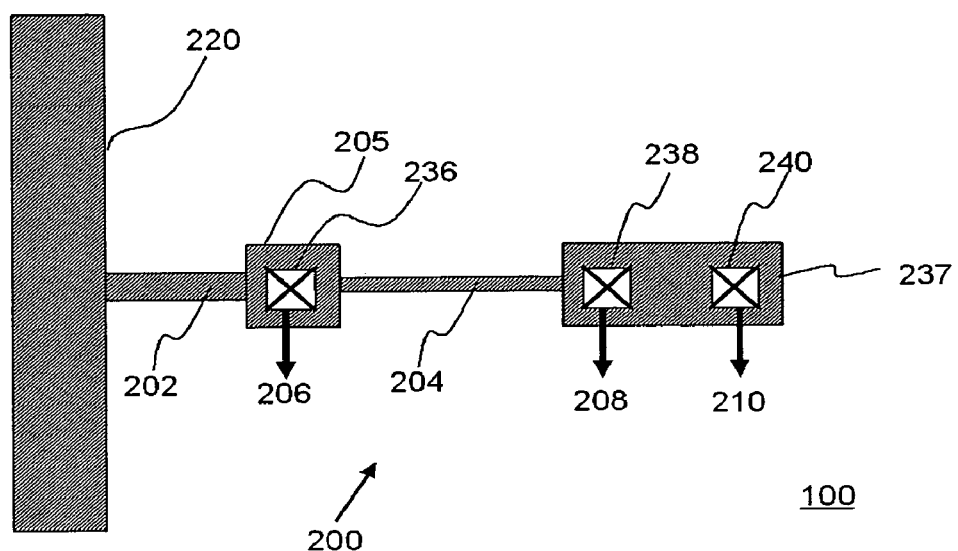
FIG. 7 is a drawing schematically showing a configuration of the semiconductor device in the embodiment of the present invention.

It is still also allowable, for example, to configure the first fuse link 202 and the second fuse link 204 using copper interconnects differing in width. FIG. 7 shows this configuration. The first fuse link 202 herein is formed with a larger width than that of the second fuse link 204. The first fuse link 202 is also formed shorter than the second fuse link 204. This configuration makes the second fuse link 204 more blowable than the first fuse link 202. The terminal 205 herein is connected via a plug 236 to the first transistor 206. On the side of the second fuse link 204 opposite to the side having the terminal 205 connected thereto, a terminal 237 is provided. The terminal 237 is connected via a plug 238 to the second transistor 208. The terminal 237 is also connected via a plug 240 to the judging circuit 210. The first fuse link 202 and the second fuse link 204 may be formed in the same layer, or may also be formed in different layers and connected through a via or the like.

Figure 5:
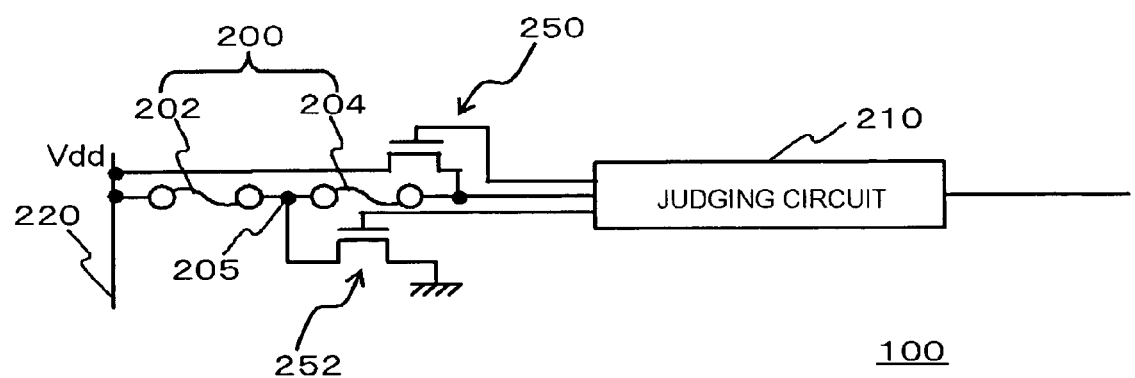
FIG. 5 is a circuit diagram showing another example of the electric fuse in the embodiment of the present invention.

FIG. 5 is a circuit diagram showing a still another example of the electric fuse in the embodiment of the present invention.

The semiconductor device 100 contains a third transistor 250 and a fourth transistor 252, in place of the first transistor 206 and the second transistor 208 shown in FIG. 1. In this configuration, the first fuse link 202 is blown first. Blowing of the first fuse link 202 can be accomplished by turning the fourth transistor 252 on and turning the third transistor 250 off. As a consequence, current from the source line 220 flows through the first fuse link 202, and thereby the first fuse link 202 is blown. Next, the second fuse link 204 is blown by turning the third transistor 250 and the fourth transistor 252 on. As a consequence, current from the source line 220 flows through the third transistor 250, the second fuse link 204 and the fourth transistor 252 in this order, to thereby blow the second fuse link 204.

As has been described in the above, various configuration may be adoptable to blow the electric fuse 200. It is, however, necessary for the configuration shown in FIG. 5 to enlarge the third transistor 250 and the fourth transistor 252, because the current flows through the third transistor 250 and the fourth transistor 252 when the second fuse link 204 is blown. In view of micronizing the semiconductor device 100, it is preferable to adopt the configuration shown in FIG. 1.

It is apparent that the present invention is not limited to the above embodiment, that may be modified and changed without departing from the scope and spirit of the invention.

What is claimed is:

1. A semiconductor device comprising:
   a semiconductor substrate;
   a current supply line provided on said semiconductor substrate;
   an electric fuse provided on said semiconductor substrate, and having a first fuse link and a second fuse link connected in series, said first fuse link and said second fuse link being configured as being different from each other in current value necessary for blowing;
   a terminal provided between said first fuse link and said second fuse link, thereby allowing current to flow selectively to said first fuse link or said second fuse link; and
   a switch element connected to said terminal, and allowing current supplied from said current supply line to selectively flow through said first fuse link,
   wherein said first fuse link is configured as being larger in the current value necessary for blowing than that of said second fuse link.

2. The semiconductor device as claimed in claim 1, wherein said first fuse link is provided between said current supply line and said terminal.

3. The semiconductor device as claimed in claim 1, further comprising:
   a current supply line provided on said semiconductor substrate;
   a first transistor having either of the source and drain connected to said terminal, and the other grounded;
   a second transistor having either of the source and drain connected to one end of the second fuse link, on the side opposite to that having said terminal provided thereto, and the other grounded;
   wherein said first fuse link is provided between said current supply line and said terminal, and is configured as being larger in the current value necessary for blowing than that of said second fuse link.

4. The semiconductor device as claimed in claim 1, wherein said first fuse link and said second fuse link are composed of different materials.

5. The semiconductor device as claimed in claim 1, wherein said first fuse link and the second fuse link have different geometries.

6. The semiconductor device as claimed in claim 1, wherein said first fuse link is composed of a copper-containing metal film having copper as a major component, and said second fuse link is composed of a polysilicon film.

7. A method of fabricating the semiconductor device described in claim 1, comprising:
   blowing said second fuse link by supplying current through said first fuse link to said second fuse link; and
   blowing said first fuse link by supplying current to said first fuse link.

8. A method of fabricating the semiconductor device described in claim 1, comprising:
   blowing said second fuse link by supplying a first current through said first fuse link to said second fuse link; and
   blowing said first fuse link by supplying a second current having a larger current value than that of said first current to said first fuse link.

9. A method of blowing an electric fuse based on current supply, the method comprising:
   supplying a first current through a first fuse link to a second fuse link, the second fuse link being provided in series with the first fuse link;
   supplying a second current having a current value which is greater than a current value of the first current to the first fuse link;
   turning off a first transistor and turning on a second transistor to allow a current to flow through the first fuse link and the second fuse link;
   blowing one of the first fuse link and the second fuse link depending on which has a greater degree of blowability;

turning on the first transistor and turning off the second transistor to allow a current to flow through the first fuse link; and blowing the first fuse link.

10. The method of claim 9, wherein the blowing of the first fuse link comprises supplying the second current to the first fuse link.

11. The method of claim 9, further comprising judging a blown state of the electric fuse.

12. The method of claim 11, wherein the judging comprises:

grounding a source line; and detecting an electric conduction with a source line to independently determine a blown state of the electric fuse.

* * * * *